(12) United States Patent
Lee et al.

(10) Patent No.: US 8,212,323 B2
(45) Date of Patent: Jul. 3, 2012

(54) SEAL RING STRUCTURE FOR INTEGRATED CIRCUITS

(75) Inventors: Tung-Hsing Lee, Taipei County (TW); Tien-Chang Chang, Hsinchu (TW); Yuan-Hung Chung, Hsinchu County (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 12/850,640

(22) Filed: Aug. 5, 2010

(65) Prior Publication Data

US 2010/0295146 A1 Nov. 25, 2010

Related U.S. Application Data

(63) Continuation of application No. 12/340,737, filed on Dec. 21, 2008, now abandoned.

(60) Provisional application No. 61/057,185, filed on May 29, 2008.

(51) Int. Cl.
| | |
|---|---|
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |
| H01L 31/00 | (2006.01) |
| H01L 23/58 | (2006.01) |
| H01L 29/06 | (2006.01) |

(52) U.S. Cl. ........ 257/409; 257/401; 257/452; 257/490; 257/496; 257/618; 257/E29.012; 257/E29.013; 257/E29.12

(58) Field of Classification Search .................. 257/401, 257/409, 452, 490, 496, 618, E29.012, E29.013, 257/E29.12
See application file for complete search history.

(56) References Cited

U.S. PATENT DOCUMENTS

| | | | | |
|---|---|---|---|---|
| 5,475,255 A | * | 12/1995 | Joardar et al. | 257/547 |
| 5,859,450 A | * | 1/1999 | Clark et al. | 257/233 |
| 6,100,118 A | * | 8/2000 | Shih et al. | 438/132 |
| 6,492,716 B1 | * | 12/2002 | Bothra et al. | 257/678 |
| 6,537,849 B1 | * | 3/2003 | Tsai et al. | 438/106 |
| 6,744,112 B2 | * | 6/2004 | Johnson et al. | 257/491 |
| 6,921,959 B2 | * | 7/2005 | Watanabe | 257/531 |
| 6,943,063 B2 | * | 9/2005 | Tsai et al. | 438/118 |
| 7,005,708 B2 | * | 2/2006 | Mergens et al. | 257/360 |
| 7,087,496 B2 | * | 8/2006 | Gutierrez | 438/294 |
| 7,202,114 B2 | * | 4/2007 | Salcedo et al. | 438/133 |
| 7,253,487 B2 | * | 8/2007 | Chen | 257/409 |
| 7,350,160 B2 | * | 3/2008 | Perez et al. | 716/119 |
| 7,466,284 B2 | | 12/2008 | Barry | |
| 7,550,850 B2 | * | 6/2009 | Nakashiba | 257/758 |

(Continued)

FOREIGN PATENT DOCUMENTS

JP 2006147668 A 6/2006

(Continued)

*Primary Examiner* — Ida M Soward
(74) *Attorney, Agent, or Firm* — Winston Hsu; Scott Margo

(57) ABSTRACT

A seal ring structure for an integrated circuit includes a seal ring being disposed along a periphery of the integrated circuit and being divided into at least a first portion and a second portion, wherein the second portion is positioned facing an analog and/or RF circuit block and is different from the first portion in structure. A $P^+$ region is provided in a P substrate and positioned under the second portion. A shallow trench isolation (STI) structure surrounds the $P^+$ region and laterally extends underneath a conductive rampart of the second portion.

25 Claims, 7 Drawing Sheets

U.S. PATENT DOCUMENTS

| | | | |
|---|---|---|---|
| 7,582,938 B2 * | 9/2009 | Chen | 257/357 |
| 7,602,065 B2 | 10/2009 | Hou | |
| 7,629,656 B2 | 12/2009 | Hasegawa | |
| 7,652,344 B2 * | 1/2010 | Uchida | 257/508 |
| 7,675,143 B2 * | 3/2010 | Kadoyama et al. | 257/659 |
| 7,893,459 B2 * | 2/2011 | Wang et al. | 257/170 |
| 7,898,027 B2 * | 3/2011 | Cheng | 257/337 |
| 2002/0164851 A1 * | 11/2002 | Wu et al. | 438/215 |
| 2006/0118904 A1 * | 6/2006 | Liaw | 257/529 |
| 2006/0267132 A1 * | 11/2006 | Lee | 257/509 |
| 2007/0001004 A1 * | 1/2007 | Mallikarjunaswamy et al. | 235/435 |
| 2007/0152275 A1 * | 7/2007 | Ker et al. | 257/357 |
| 2008/0061397 A1 * | 3/2008 | Uchida | 257/508 |
| 2008/0230873 A1 | 9/2008 | Demircan | |
| 2009/0201043 A1 | 8/2009 | Kaltalioglu | |

FOREIGN PATENT DOCUMENTS

JP        200871818 A        3/2008

* cited by examiner

SEAL RING STRUCTURE FOR INTEGRATED CIRCUITS

CROSS REFERENCE TO RELATED APPLICATIONS

The present application is a Continuation Application of U.S. patent application Ser. No. 12/340,737, which was filed on Dec. 21, 2008, and claimed the benefit of the filing date under 35 U.S.C. §119(e) of a Provisional U.S. Patent Application No. 61/057,185, filed on May 29, 2008, which is incorporated by reference herein.

BACKGROUND OF THE INVENTION

1. Field of the Invention

The present invention related to semiconductor devices and, more particularly, to a seal ring structure for an integrated circuit that is capable of reducing substrate noise coupling.

2. Description of the Prior Art

Advances in fabrication technology have enabled entire functional blocks, which previously had been implemented as plural chips on a circuit board, to be integrated onto a single IC. One particularly significant development is mixed-signal circuits, which combine analog circuitry and digital logic circuitry onto a single IC.

However, a major technical hurdle to implementing mixed-signal circuits has been the coupling of noise between different portions of the IC, for example, from the digital to the analog portions. Ordinarily, an integrated circuit chip includes a seal ring used to protect it from moisture degradation or ionic contamination. Typically, the seal ring is made of a stack of metal and contact/via layers and is manufactured step by step as sequential depositions of insulators and metals in conjunction together with the fabrication of the integrated circuit elements.

It has been found that the noise, such as digital noise, which, for example, may be originated from a digital power signal line such as $V_{DD}$ or signal pad of a digital circuit, propagates through the seal ring and adversely affects the performance of the sensitive analog and/or RF circuit.

FIG. 1 is a schematic, cross-sectional diagram showing a seal ring structure 524 according to the related art. As shown in FIG. 1, the seal ring structure 524 is divided into two portions including a first portion 524a and a second portion 524b spaced apart from the first portion 524a. Between the first portion 524a and the second portion 524b, there is provided a chipped region 525. The second portion 524b comprises a conductive rampart 701 that is made of a stack of metal layers (M1 and M2) and contact/via layers (C and V1). The second portion 524b further comprises a $P^+$ region 702 situated under the conductive rampart 701 and a P well 704 under the $P^+$ region 702. The $P^+$ region 702 and the P well 704 are isolated from the $P^+$ region 602 and the P well 604 under the conductive rampart 601 of the first portion 524a by a shallow trench isolation (STI) structure 760.

SUMMARY OF THE INVENTION

It is one object of the present invention to provide an improved seal ring structure of an integrated circuit chip, which is capable of reducing the digital noise coupling from a digital circuit.

The above object will be achieved by the seal ring structure in the present invention. In one aspect, the seal ring structure for an integrated circuit comprises a seal ring, a $P^+$ region, and a shallow trench isolation (STI) structure. The seal ring is disposed along a periphery of the integrated circuit and is divided into at least a first portion and a second portion. The second portion is positioned facing an analog and/or RF circuit block and is different from the first portion in structure. The $P^+$ region is provided in a P substrate and positioned under the second portion. The STI structure surrounds the $P^+$ region and laterally extends underneath a conductive rampart of the second portion.

In another aspect, the present invention provides a seal ring structure for an integrated circuit comprising a seal ring, a deep N well, a $P^+$ region, and a shallow trench isolation (STI) structure. The seal ring is disposed along a periphery of the integrated circuit and is divided into at least a first portion and a second portion. The second portion is positioned facing an analog and/or RF circuit block and is different from the first portion in structure. The deep N well is provided in a P substrate and positioned under the second portion. The $P^+$ region is within the deep N well. The STI structure surrounds the $P^+$ region and laterally extends underneath a conductive rampart of the second portion.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The present invention pertains to a seal ring structure for an integrated circuit chip. The number of seal ring(s) in the seal ring structure depends on requirements and is not limited to what is illustrated in the embodiments. If there is an outer seal ring, it may be a continuous ring, while an inner seal ring may be divided into at least two portions including a conductive rampart that is situated in front of a sensitive analog and/or RF circuit block of the integrated circuit chip.

A deep N well under the conductive rampart shields the analog and/or RF circuit from substrate noise, which, for example, propagates through the outer seal ring, thereby reducing the noise-coupling effects. The continuous outer seal ring keeps the moisture and corrosive substances from entering the IC. The present invention is capable of mitigating or eliminating resistive coupling noise by extending underneath a separated metal rampart portion of an inner seal ring and/or removing a P well from underneath the separated metal rampart portion of the inner seal ring. The resistive coupling is switching transients coupled resistively into bulk through P+ bulk contact, if bulk is biased with a switching ground.

Figure 1:
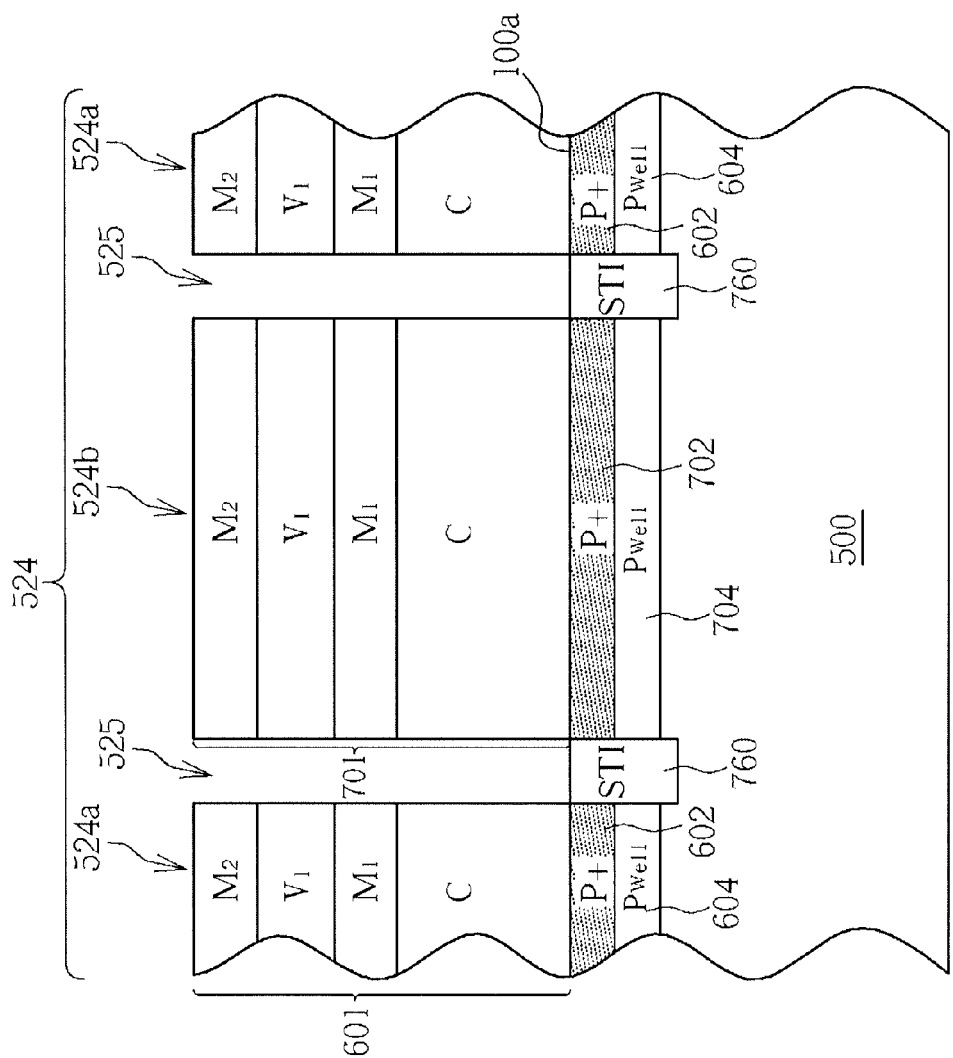
FIG. 1 is a schematic, cross-sectional diagram showing a seal ring structure according to the related art.
Figure 2:
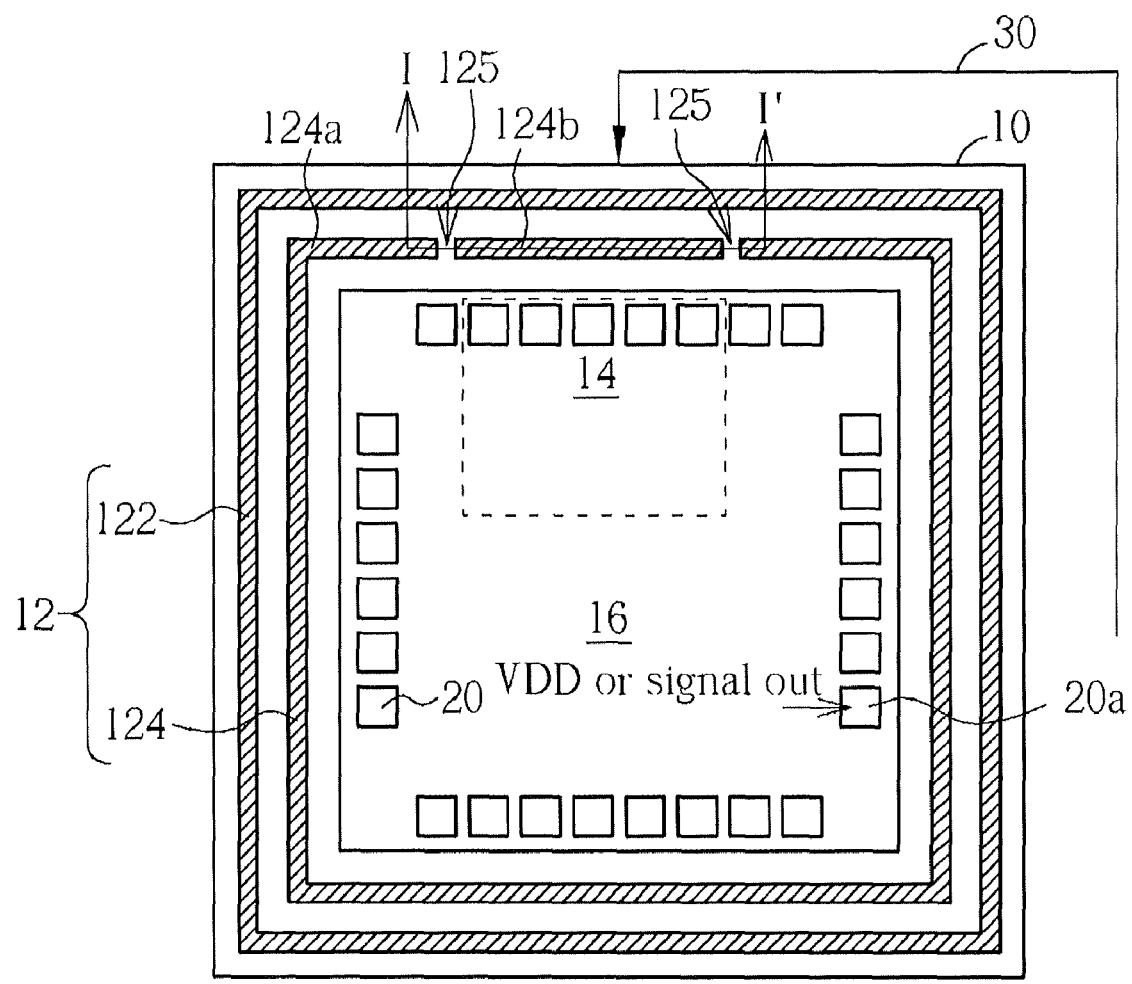
FIG. 2 is a schematic, planar view of an integrated circuit chip with a seal ring structure in accordance with one embodiment of this invention.
Figure 3:
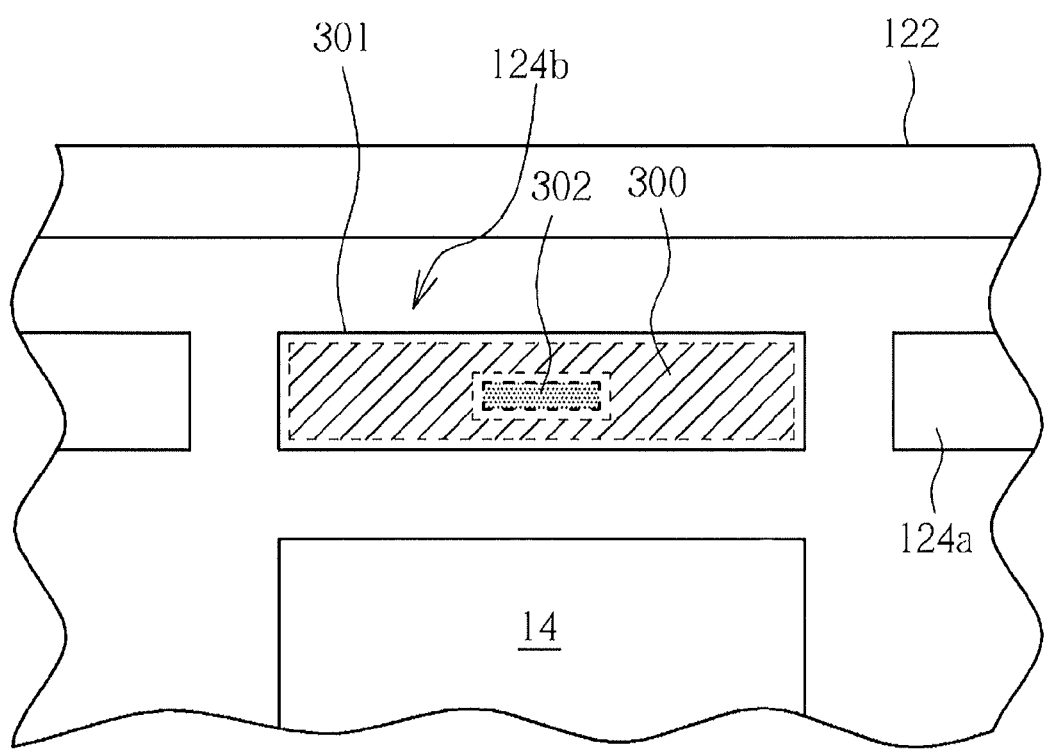
FIG. 3 is a perspective, enlarged top view showing layout of the second portion of the seal ring according to this invention.
Figure 4:
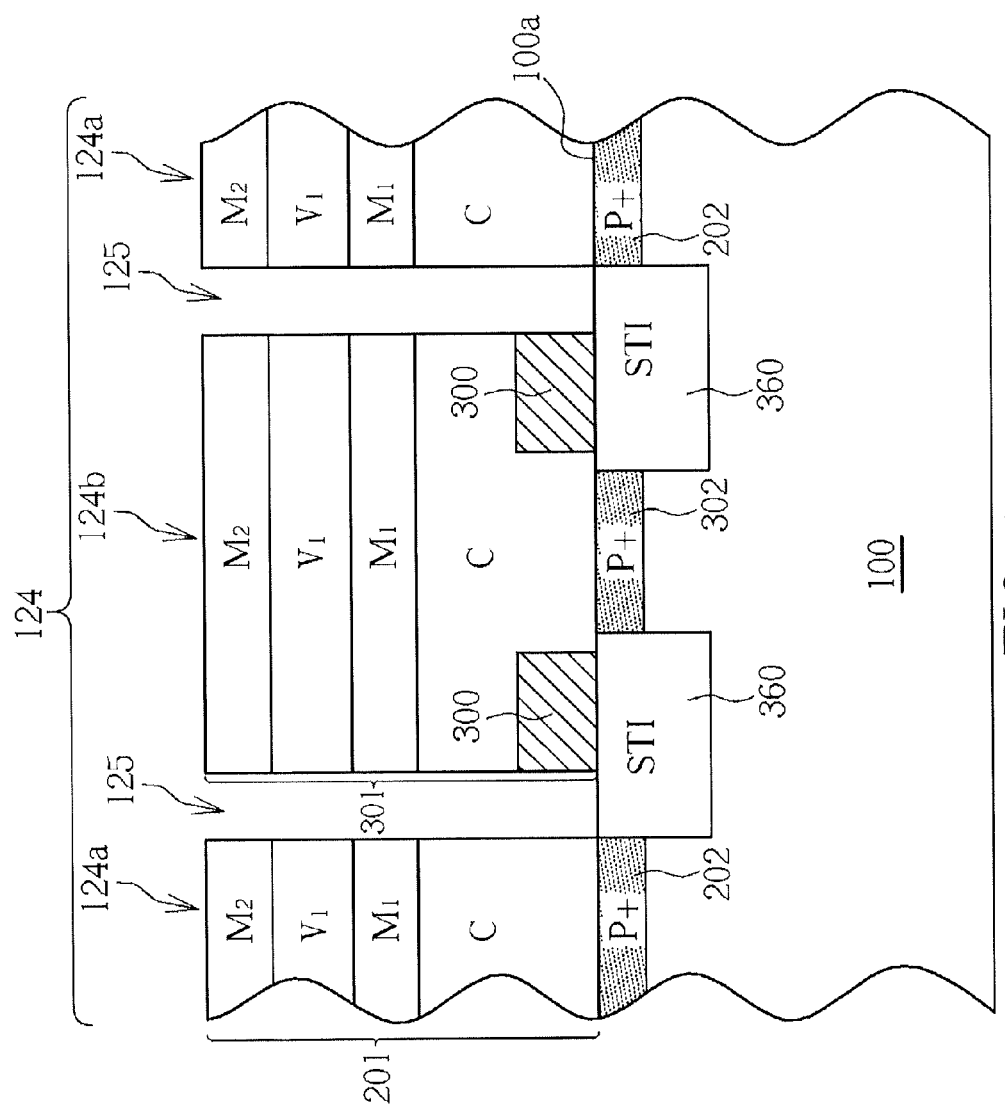
FIG. 4 is a schematic, cross-sectional view taken along line I-I' of FIG. 2.

Please refer to FIG. 2 to FIG. 4. FIG. 2 is a schematic, planar view of an integrated circuit chip 10 with a seal ring structure 12 in accordance with one embodiment of this invention. FIG. 3 is a perspective, enlarged top view showing layout of the second portion of the seal ring according to this invention. FIG. 4 is a schematic, cross-sectional view taken along line I-I' of FIG. 2. As shown in FIG. 2, the integrated circuit chip 10 comprises at least one analog and/or RF circuit block 14, a digital circuit 16 and a seal ring structure 12 surrounding and protecting the analog and/or RF circuit block 14 and digital circuit 16.

The integrated circuit chip 10 further comprises a plurality of input/output (I/O) pads 20. As previously described, noises such as those originated from a digital power $V_{DD}$ signal line or a signal output pad 20a of the digital circuit 16 can propagates through the seal ring and adversely affects the performance of the sensitive analog and/or RF circuit 14. The noise propagation path 30 is specifically indicated in FIG. 2. The noise may also propagate through the substrate and adversely affects the sensitive analog and/or RF circuit 14. The present invention aims to tackle this problem.

According to the present invention, the seal ring structure 12, which is disposed along the periphery of the chip, includes a continuous outer seal ring 122 and a discontinuous inner seal ring 124. Though a double seal ring structure 12 is shown in this embodiment, the number of seal ring(s) in the seal ring structure depends on requirements and is not limited to what is illustrated herein. Besides, though the outer seal ring 122 is continuous and the inner seal ring 124 is discontinuous in this embodiment, the outer one could be either continuous or discontinuous, and the inner one could be either continuous or discontinuous as well. The inner seal ring 124 is divided into at least two portions including a first portion 124a and a second portion 124b spaced apart from the first portion 124a. Between the first portion 124a and the second portion 124b, there is provided a chipped region 125.

As shown in FIG. 4, the first portion 124a and the second portion 124b are different from each other mainly underneath the main surface 100a of the P substrate 100. The first portion 124a comprises a conductive rampart 201 that is made of a stack of metal layers such as M1 and M2 and contact/via layers such as C and V1 and is manufactured step by step as sequential depositions of insulators and metals in conjunction together with the fabrication of the integrated circuit elements. The first portion 124a further comprises a P+ region 202 situated under the conductive rampart 201. There may not be P well under the P+ region 202 according to this invention.

The second portion 124b may be positioned directly facing the analog and/or RF circuit block 14 for shielding the noise propagating through the continuous outer seal ring 122. Preferably, the length of the second portion 124b is equal to or greater than the span of the shielded analog and/or RF circuit block 14. Above the main surface 100a of the P substrate 100, likewise, the second portion 124b comprises a conductive rampart 301 that is made of a stack of an annular polysilicon layer 300, metal layers such as M1 and M2 and contact/via layers such as C and V1 and is manufactured step by step as sequential depositions of insulators and metals in conjunction together with the fabrication of the integrated circuit elements.

FIG. 3 schematically shows the layout of the second portion 124b of the inner seal ring 124 according to this invention. As shown in FIG. 3, the annular polysilicon layer 300, which is indicated by shadow region, is situated under the conductive rampart 301 and surrounds the small P+ region 302. The polysilicon layer 300 is provided on the STI structure 360 in order to support contact mechanical strength and to prevent die saw problem. The STI structure 360 extends laterally underneath the conductive rampart 301 to increase the resistance, thereby reducing the substrate noise coupling.

The present invention features the seal ring structure underneath the main surface 100a of the P substrate 100. Under the conductive rampart 301, the second portion 124b further comprises a small P+ region 302 surrounded by shallow trench isolation (STI) structure 360. According to this invention, the small P+ region 302 has a minimized surface area and may be fabricated by using critical dimension design rules. The small P+ region 302 allows the passage of moisture or ions in the fabrication processes. In another case, however, the P+ region 302 may be omitted or removed from underneath the conductive rampart 301. The removal of the P+ region 302 can increase the resistance thus suppressing the substrate resistive coupling noise. By extending the STI into underneath the conductive rampart 301 and by removing the P well from the inner seal ring 124, the resistive coupling effect can be mitigated or eliminated.

Figure 5:
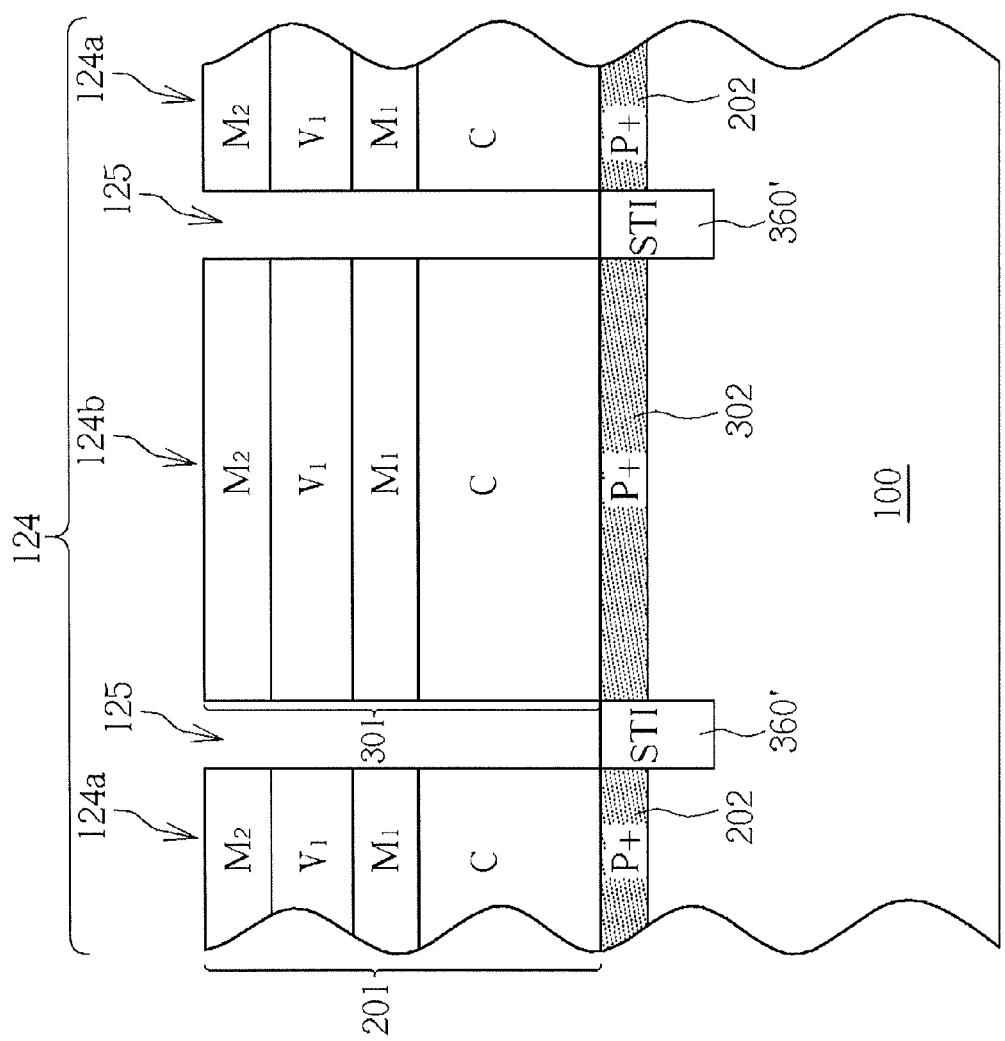
FIG. 5 is a schematic, cross-sectional view illustrating another embodiment of this invention.

FIG. 5 is a schematic, cross-sectional view illustrating another embodiment of this invention. As shown in FIG. 5, the seal ring structure 124 is divided into two portions including a first portion 124a and a second portion 124b spaced apart from the first portion 124a. Between the first portion 124a and the second portion 124b, there is provided a chipped region 125. The second portion 124b comprises a conductive rampart 301 that is made of a stack of metal layers (M1 and M2) and contact/via layers (C and V1). The second portion 124b further comprises a P+ region 302 situated under the conductive rampart 301. The P+ region 302 are isolated from the P+ region 202 under the conductive rampart 201 of the first portion 124a by STI structure 360' that does not extend laterally underneath the conductive rampart 301. The P well is removed from the seal ring structure to increase the substrate resistance.

Figure 6:
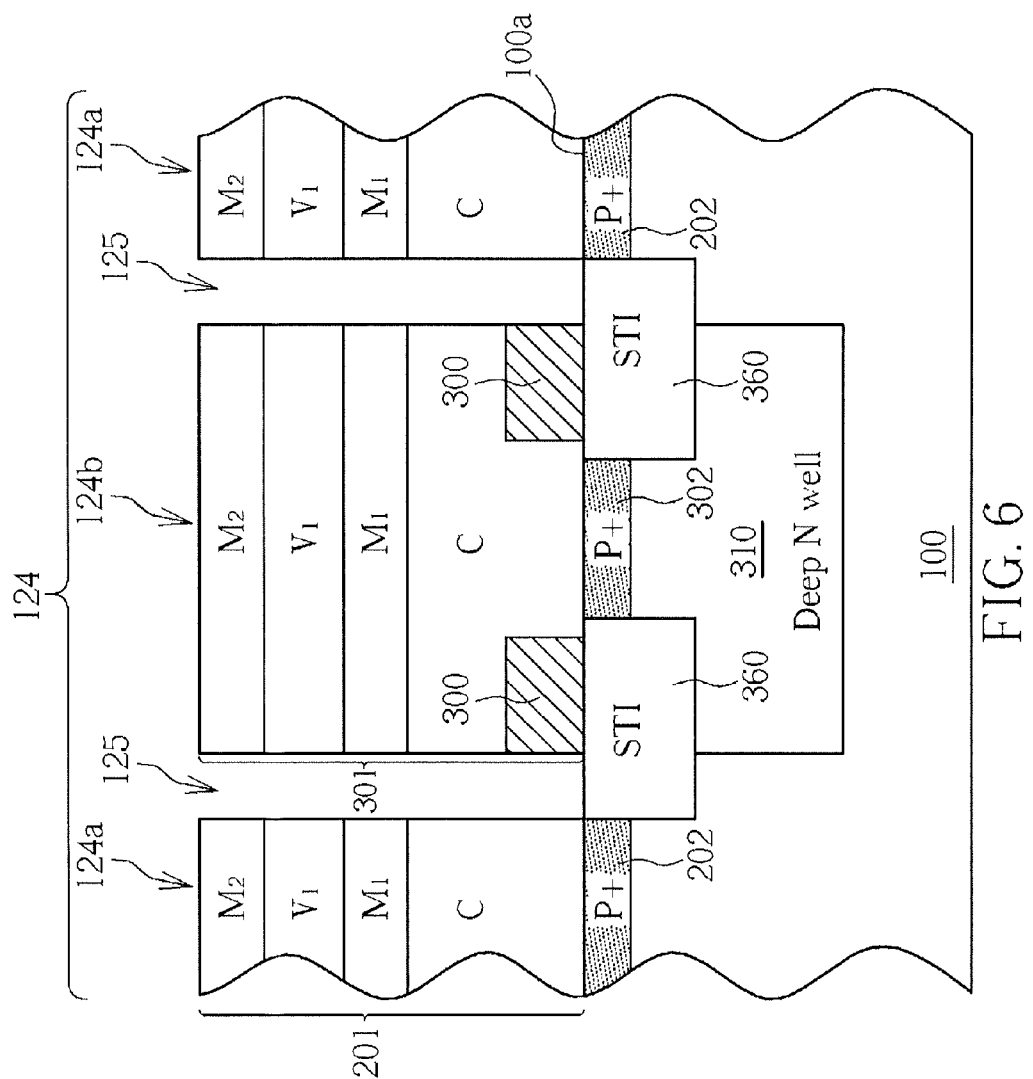
FIG. 6 is a schematic, cross-sectional view illustrating yet another embodiment of this invention.

FIG. 6 is a schematic, cross-sectional view illustrating yet another embodiment of this invention. As shown in FIG. 6, under the conductive rampart 301 of the second portion 124b of the inner seal ring 124, P+ region 302, STI structure 360 and a deep N well 310 are provided. According to this invention, the deep N well 310 may have a junction depth of about 19000-21000 angstroms. The deep N well 310 may be grounded or coupled to a supply voltage, such as $V_{DD}$. It is advantageous to use the present invention because the deep N well 310 situated under the second portion 124b can suppress capacitive coupling.

Figure 7:
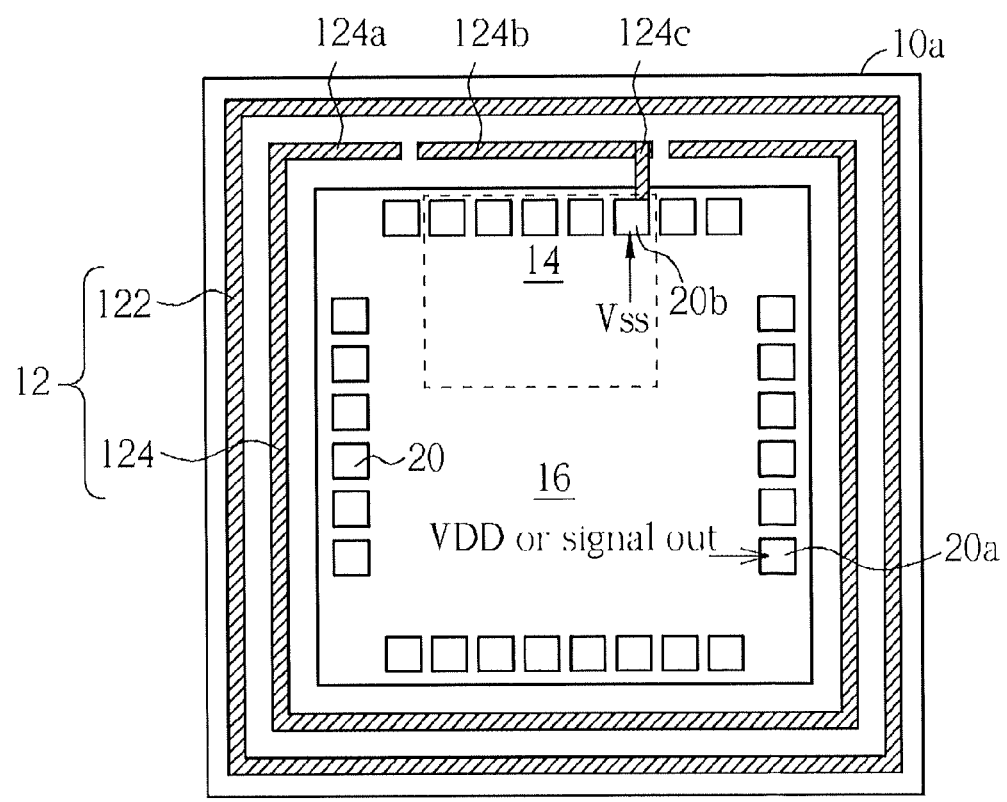
FIG. 7 is a schematic, planar view of an integrated circuit chip with a seal ring structure in accordance with another preferred embodiment of this invention.

FIG. 7 is a schematic, planar view of an integrated circuit chip 10a with a seal ring structure 12 in accordance with another preferred embodiment of this invention, wherein like numeral numbers designate like regions, layers or elements. As shown in FIG. 7, likewise, the integrated circuit chip 10a comprises at least one analog and/or RF circuit block 14, a digital circuit 16 and a seal ring structure 12 surrounding and protecting the analog and/or RF circuit block 14 and digital circuit 16. The integrated circuit chip 10a further comprises a plurality of I/O pads 20. Noises such as those originated from a digital power $V_{DD}$ signal line or a signal output pad 20a of the digital circuit 16 may propagate through the seal ring and adversely affects the performance of the sensitive analog and/or RF circuit block 14.

The seal ring structure 12 includes a continuous outer seal ring 122 and a discontinuous inner seal ring 124. Though a double seal ring structure 12 is shown in this embodiment, the number of seal ring(s) in the seal ring structure depends on requirements and is not limited to what is illustrated herein. Besides, though the outer seal ring 122 is continuous and the inner seal ring 124 is discontinuous in this embodiment, the outer one could be either continuous or discontinuous, and the inner one could be either continuous or discontinuous as well. The inner seal ring 124 is divided into two portions including a first portion 124a and a second portion 124b. The second portion 124b serves to shield the noise propagating through the outer seal ring 122. Preferably, the length of the second portion 124b is equal to or greater than the span of the shielded analog and/or RF circuit block 14.

The ring structure of the second portion 124b may be similar to that as set forth in FIG. 3 and FIG. 4. According to this invention, the second portion 124b may be coupled to an independent ground or an independent supply voltage. According to this invention, the second portion 124b may be coupled to the independent ground through an independent pad and an interconnection trace. The term "independent" used herein means that the ground, pad or supply voltage is not commonly used by the analog circuit, RF circuit or digital circuit.

In this embodiment, the second portion 124b may be coupled to an independent pad 20b through an interconnection trace 124c. The interconnection trace 124c may be comprised of a topmost metal layer of the integrated circuit chip 10a and an aluminum layer (not shown). By doing this, the second portion 124b could be coupled to an independent ground (not shown) or an independent supply voltage, such as $V_{SS}$, and the noise coupling can be significantly reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A seal ring structure for an integrated circuit, comprising:
   a seal ring being disposed along a periphery of the integrated circuit and being divided into at least a first portion and a second portion, wherein the second portion is positioned facing an analog and/or RF circuit block and is different from the first portion in structure;
   a P+ region in a P substrate and positioned under the second portion;
   a shallow trench isolation (STI) structure surrounding the P+ region and laterally extending underneath a conductive rampart of the second portion; and
   a continuous outer seal ring outside the seal ring.

2. The seal ring structure according to claim 1 wherein the second portion comprises a conductive rampart that is a stack comprising a polysilicon layer, a metal layer, a contact/via layer, or a combination thereof and is manufactured together with the fabrication of the integrated circuit.

3. The seal ring structure according to claim 1 wherein the seal ring is discontinuous, the second portion is spaced apart from the first portion.

4. The seal ring structure according to claim 1 wherein a length of the second portion is equal to or greater than a span of the shielded analog and/or RF circuit block.

5. The seal ring structure according to claim 1 wherein the second portion comprises a conductive rampart that is a stack comprising a polysilicon layer that is in direct contact with a contact/via layer.

6. The seal ring structure according to claim 5 wherein the polysilicon layer is an annular polysilicon layer surrounding the P+ region.

7. The seal ring structure according to claim 6 wherein the polysilicon layer is situated directly on the STI structure.

8. A seal ring structure for an integrated circuit, comprising:
   a seal ring being disposed along a periphery of the integrated circuit and being divided into at least a first portion and a second portion, wherein the second portion is positioned facing an analog and/or RF circuit block and is different from the first portion in structure;
   a P+ region in a P substrate and positioned under the second portion; and
   a shallow trench isolation (STI) structure surrounding the P+ region and laterally extending underneath a conductive rampart of the second portion;
   wherein no P well is formed under the P+ region.

9. The seal ring structure according to claim 8 wherein the seal ring is discontinuous, the second portion is spaced apart from the first portion.

10. The seal ring structure according to claim 8 wherein a length of the second portion is equal to or greater than a span of the shielded analog and/or RF circuit block.

11. The seal ring structure according to claim 8 wherein the second portion comprises a conductive rampart that is a stack comprising a polysilicon layer, a metal layer, a contact/via layer, or a combination thereof and is manufactured together with the fabrication of the integrated circuit.

12. The seal ring structure according to claim 8 wherein the second portion comprises a conductive rampart that is a stack comprising a polysilicon layer that is in direct contact with a contact/via layer.

13. The seal ring structure according to claim 12 wherein the polysilicon layer is an annular polysilicon layer surrounding the P+ region.

14. The seal ring structure according to claim 13 wherein the polysilicon layer is situated directly on the STI structure.

15. A seal ring structure for an integrated circuit, comprising:
   a seal ring being disposed along a periphery of the integrated circuit and being divided into at least a first portion and a second portion, wherein the second portion is positioned facing an analog and/or RF circuit block and is different from the first portion in structure;
   a deep N well in a P substrate and positioned under the second portion;
   a P+ region within the deep N well; and
   a shallow trench isolation (STI) structure surrounding the P+ region and laterally extending underneath a conductive rampart of the second portion.

16. The seal ring structure according to claim 15 wherein the seal ring is discontinuous, the second portion is spaced apart from the first portion.

17. The seal ring structure according to claim 15 further comprising a continuous outer seal ring outside the seal ring.

18. The seal ring structure according to claim 15 wherein a length of the second portion is equal to or greater than a span of the shielded analog and/or RF circuit block.

19. The seal ring structure according to claim 15 wherein the deep N well has a junction depth of about 19000-21000 angstroms.

20. The seal ring structure according to claim 15 wherein the deep N well is grounded or coupled to a supply voltage.

21. The seal ring structure according to claim 15 wherein the second portion comprises a conductive rampart that is a stack comprising a polysilicon layer, a metal layer, a contact/via layer, or a combination thereof and is manufactured together with the fabrication of the integrated circuit.

22. The seal ring structure according to claim 15 wherein no P well is formed under the P+ region.

23. The seal ring structure according to claim 15 wherein the second portion comprises a conductive rampart that is a stack comprising a polysilicon layer that is in direct contact with a contact/via layer.

24. The seal ring structure according to claim 23 wherein the polysilicon layer is an annular polysilicon layer surrounding the P+ region.

25. The seal ring structure according to claim 24 wherein the polysilicon layer is situated directly on the STI structure.

* * * * *